(12) United States Patent
Luan (10) Patent No.: US 9,645,238 B1
(45) Date of Patent: May 9, 2017

(54) PROXIMITY SENSOR, ELECTRONIC APPARATUS AND METHOD FOR MANUFACTURING PROXIMITY SENSOR

(71) Applicant: STMICROELECTRONICS PTE LTD, Singapore (SG)

(72) Inventor: Jing-En Luan, Shenzhen (CN)

(73) Assignee: STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 14/981,196

(22) Filed: Dec. 28, 2015

(30) Foreign Application Priority Data

Nov. 2, 2015 (CN) .......................... 2015 1 0734019

(51) Int. Cl.
*G01J 1/42* (2006.01)
*G01S 17/02* (2006.01)
*G01J 1/04* (2006.01)

(52) U.S. Cl.
CPC ........... *G01S 17/026* (2013.01); *G01J 1/0488* (2013.01); *G01J 1/42* (2013.01)

(58) Field of Classification Search
CPC .. G01J 5/08; G01J 5/024; G01J 1/0233; G01J 1/4228; G01J 1/42; G06F 1/1684; G01S 17/026

See application file for complete search history.

(56) References Cited

U.S. PATENT DOCUMENTS

2004/0238726 A1* 12/2004 Caldwell ................ A47B 57/00
250/221
2013/0153772 A1* 6/2013 Rossi .................... G01S 17/026
250/353

\* cited by examiner

*Primary Examiner* — David Porta
*Assistant Examiner* — Faye Boosalis
(74) *Attorney, Agent, or Firm* — Seed IP Law Group LLP (57) ABSTRACT

The embodiments of the present disclosure provide a proximity sensor, an electronic apparatus and a method for manufacturing a proximity sensor. The proximity sensor comprises a substrate, a sensor chip, a light-emitting device, a non-transparent isolation structure and a non-transparent molding material, wherein the sensor chip is located on the substrate and electrically coupled to the substrate; the light-emitting device is located on the sensor chip and electrically coupled to the sensor chip; the non-transparent isolation structure is located on the sensor chip and isolates the light-emitting device from a sensor region of the sensor chip; and the non-transparent molding material at least partially covers the substrate, the sensor chip and the non-transparent isolation structure, such that a portion of the proximity sensor which is located right above the sensor region and the light-emitting device is not covered by the non-transparent molding material.

23 Claims, 8 Drawing Sheets

PROXIMITY SENSOR, ELECTRONIC APPARATUS AND METHOD FOR MANUFACTURING PROXIMITY SENSOR

BACKGROUND

Technical Field

The embodiments of the present disclosure relate to the field of image sensor apparatuses, and more particularly to a proximity sensor, an electronic apparatus and a method for manufacturing a proximity sensor.

Description of the Related Art

Generally speaking, an electronic apparatus may contain one or more image sensor modules for providing an enhanced media function. For example, a typical electronic apparatus may utilize an image sensor module for image capturing or video teleconferencing. Some electronic apparatuses comprise additional image sensor apparatuses for other purposes, such as a proximity sensor.

For example, an electronic apparatus may use a proximity sensor to provide an object distance for providing focusing adjustment for a camera-dedicated image sensor module. In mobile apparatus applications, when a user's hand is in the proximity, a proximity sensor may be used for detection, so as to rapidly and accurately wake up an apparatus from a power-saving sleep mode. Generally speaking, the proximity sensor comprises a light-emitting device for directing radiation to a potential object nearby, and a sensor chip for receiving the radiation reflected by the object nearby.

Figure 1:
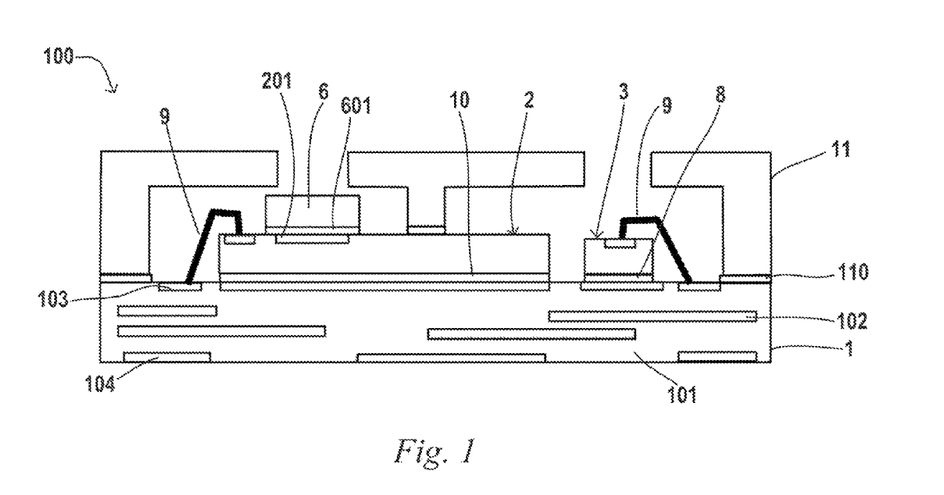
FIG. 1 shows a cross-sectional schematic diagram of a proximity sensor in the prior art.

FIG. 1 shows a cross-sectional schematic diagram of a proximity sensor 100 in the prior art. As shown in FIG. 1, the proximity sensor 100 comprises a substrate 1, a sensor chip 2 and a light-emitting device 3 on the substrate 1, and a cap 11 which is located on the substrate 1 and the sensor chip 2 via an adhesive 110 and has an opening therein. The substrate 1 comprises a dielectric layer 101, a plurality of conductive traces 102 between the dielectric layer 101, and a first conductive contact 103 and a second conductive contact 104 which are supported by the dielectric layer 101 and coupled to the conductive traces 102, wherein the first conductive contact 103 is provided at an upper surface of the substrate 1, and the second conductive contact 104 is provided at a lower surface of the substrate 1. The sensor chip 2 is attached to the upper surface of the substrate 1 via an adhesive 10. The light-emitting device 3 is attached to the upper surface of the substrate 1 via a conductive attachment material 8. The sensor chip 2 and the light-emitting device 3 are coupled electrically to the first conductive contact 103 on the substrate 1 respectively via corresponding welding wires 9. The proximity sensor 100 further comprises a light-transmitting component 6 provided above a sensor region 201 of the sensor chip 2 via a transparent adhesive 601, e.g., an optical filter, etc.

In the proximity sensor 100 as shown in FIG. 1, since the price of the cap 11 is relatively high, the manufacturing costs of the entire proximity sensor 100 are relatively high. In addition, when such a proximity sensor 100 is manufactured, a separate cap 11 is mounted for each individual proximity sensor 100, which makes the manufacturing process take a longer time, thereby reducing productivity.

BRIEF SUMMARY

One or more embodiments of the present disclosure is to provide a novel proximity sensor and a method for manufacturing such a proximity sensor, which may reduce manufacturing costs and/or increase productivity.

According to one aspect of the present disclosure, a proximity sensor is provided, comprising: a substrate; a sensor chip located on the substrate and electrically coupled to the substrate; a light-emitting device located on the sensor chip and electrically coupled to the sensor chip; a non-transparent isolation structure located on the sensor chip and isolating the light-emitting device from a sensor region of the sensor chip; and a non-transparent molding material at least partially covering the substrate, the sensor chip and the non-transparent isolation structure, such that a portion of the proximity sensor which is located right above the sensor region and the light-emitting device is not covered by the non-transparent molding material.

According to one exemplary embodiment of the present disclosure, the non-transparent isolation structure comprises a first opening and a second opening respectively aligned with the sensor region and the light-emitting device.

According to one exemplary embodiment of the present disclosure, the proximity sensor further comprises a first light-transmitting component covering the first opening and a second light-transmitting component covering the second opening.

According to one exemplary embodiment of the present disclosure, the non-transparent isolation structure further comprises a limit part for limiting horizontal positions of the first light-transmitting component and the second light-transmitting component.

According to one exemplary embodiment of the present disclosure, the non-transparent molding material partially covers the first light-transmitting component and the second light-transmitting component, such that a portion of the first light-transmitting component which is located right above the sensor region is not covered by the non-transparent molding material, and such that a portion of the second light-transmitting component which is located right above the light-emitting device is not covered by the non-transparent molding material.

According to one exemplary embodiment of the present disclosure, the proximity sensor further comprises a transparent adhesive filled in the first opening and the second opening for adhering the first light-transmitting component and the second light-transmitting component to the sensor chip.

According to one exemplary embodiment of the present disclosure, the non-transparent isolation structure is formed on the sensor chip via a molding process.

According to one exemplary embodiment of the present disclosure, the non-transparent isolation structure is adhered to the sensor chip via an adhesive.

According to one exemplary embodiment of the present disclosure, the light-emitting device is attached to the sensor chip via a conductive attachment material.

According to another aspect of the present disclosure, an electronic apparatus is provided, comprising any one of the proximity sensors mentioned above.

According to another aspect of the present disclosure, a method for manufacturing a proximity sensor is provided, comprising: providing a sensor chip, the sensor chip comprising a sensor region and an attachment region for attaching a light-emitting device; providing a non-transparent isolation structure on the sensor chip, the non-transparent isolation structure isolating the sensor region from the attachment region; arranging the sensor chip on a substrate and electrically coupling the sensor chip to the substrate; providing a light-emitting device on the attachment region and electrically coupling the light-emitting device to the sensor chip; and at least partially covering the substrate, the sensor chip and the non-transparent isolation structure using a non-transparent molding material, such that a portion of the proximity sensor which is located right above the sensor region and the light-emitting device is not covered by the non-transparent molding material.

According to one exemplary embodiment of the present disclosure, the non-transparent isolation structure comprises a first opening and a second opening, and when providing the non-transparent isolation structure on the sensor chip, the first opening and the second opening are respectively aligned with the sensor region and the attachment region.

According to one exemplary embodiment of the present disclosure, the method further comprises: after electrically coupling the light-emitting device to the sensor chip and before covering using the non-transparent molding material, covering the first opening using a first light-transmitting component, and covering the second opening using a second light-transmitting component.

According to one exemplary embodiment of the present disclosure, the non-transparent isolation structure further comprises a limit part for limiting horizontal positions of the first light-transmitting component and the second light-transmitting component.

According to one exemplary embodiment of the present disclosure, the method further comprises: after covering the first opening using a first light-transmitting component and covering the second opening using a second light-transmitting component, at least partially covering the first light-transmitting component and the second light-transmitting component using the non-transparent molding material, such that a portion of the first light-transmitting component which is located right above the sensor region is not covered by the non-transparent molding material, and such that a portion of the second light-transmitting component which is located right above the light-emitting device is not covered by the non-transparent molding material.

According to one exemplary embodiment of the present disclosure, the method further comprises: after electrically coupling the light-emitting device to the sensor chip and before covering the first opening using a first light-transmitting component and covering the second opening using a second light-transmitting component, filling, in the first opening and the second opening, a transparent adhesive for adhering the first light-transmitting component and the second light-transmitting component to the sensor chip.

According to one exemplary embodiment of the present disclosure, providing a non-transparent isolation structure on the sensor chip comprises: forming the non-transparent isolation structure on the sensor chip via a molding process.

According to one exemplary embodiment of the present disclosure, providing a non-transparent isolation structure on the sensor chip comprises: adhering the non-transparent isolation structure to the sensor chip via an adhesive.

According to one exemplary embodiment of the present disclosure, the light-emitting device is attached to the sensor chip via a conductive attachment material.

According to one exemplary embodiment of the present disclosure, the method further comprises: after covering by the non-transparent molding material, carrying out singulation processing.

In various embodiments of the present disclosure, by providing a light-emitting device on a sensor chip and adopting a non-transparent isolation structure and molding material to package a proximity sensor, the use of a cap is avoided, which can reduce the manufacturing costs of the proximity sensor, and can improve productivity.

BRIEF DESCRIPTION OF THE SEVERAL VIEWS OF THE DRAWINGS

When reading the detailed description of an exemplary embodiment below in conjunction with the accompanying drawings, these and other objectives, features and advantages will become apparent, in which.

DETAILED DESCRIPTION OF THE DRAWINGS

The principles and method of the present disclosure will be described below with reference to several exemplary embodiments in the accompanying drawings. It should be understood that the description of these embodiments is merely to enable those skilled in the art to better understand and thus to implement the present disclosure, rather than limiting the scope of the present disclosure by any means.

Figure 2:
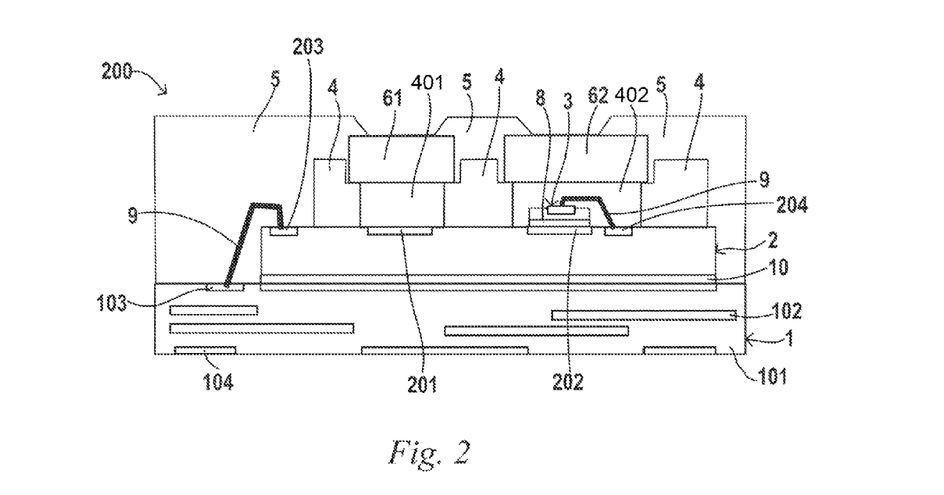
FIG. 2 shows a cross-sectional schematic diagram of a proximity sensor according to an exemplary embodiment of the present disclosure.

FIG. 2 shows a cross-sectional schematic diagram of a proximity sensor 200 according to an exemplary embodiment of the present disclosure. As shown in FIG. 2, the proximity sensor 200 may comprise a substrate 1, a sensor chip 2, a light-emitting device 3, a non-transparent isolation structure 4 and a non-transparent molding material 5. The sensor chip 2 is located on the substrate 1 and electrically coupled to the substrate 1. The light-emitting device 3 is located on the sensor chip 2 and electrically coupled to the sensor chip 2. The non-transparent isolation structure 4 is located on the sensor chip 2 and isolates the light-emitting device 3 from a sensor region 201 of the sensor chip 2. The non-transparent molding material 5 at least partially covers the substrate 1, the sensor chip 2 and the non-transparent isolation structure 4, such that a portion of the proximity sensor 200 which is located right above the sensor region 201 and the light-emitting device 3 is not covered by the non-transparent molding material 5.

As shown in FIG. 2, the substrate 1 exemplarily comprises a dielectric layer 101, a plurality of conductive traces 102 between the dielectric layer 101, and a first conductive contact 103 and a second conductive contact 104 which are supported by the dielectric layer 101 and coupled to the conductive traces 102. The first conductive contact 103 is provided at an upper surface of the substrate 1 for electrically coupling to the sensor chip 2. The second conductive contact 104 is provided at a lower surface of the substrate 1 for electrically coupling to an external circuit.

In other embodiments, the substrate 1 may be in other forms. For example, the substrate 1 may be made of a semiconductor material in which one or more integrated circuits are formed. In such an embodiment, the sensor chip 2 may be electrically coupled to the circuit in the substrate 1.

The sensor chip 2 may be adhered to the upper surface of the substrate 1 via an adhesive 10. The sensor chip 2 comprises a sensor region 201 and an attachment region 202 for attaching a light-emitting device 3. The sensor region 201 and the attachment region 202 are provided spaced apart on an upper surface of the sensor chip 2. The sensor region 201 is used for receiving radiation reflected by an object nearby. The sensor chip 2 may further comprise conductive contacts 203 and 204 provided on the upper surface thereof. The conductive contact 203 may be electrically connected to the first conductive contact 103 which is at the upper surface of the substrate 1 via a conductive wire 9.

The light-emitting device 3 may comprise a vertical cavity surface emitting laser (VCSEL) or a light-emitting diode (LED), e.g., an infrared LED. The light-emitting device 3 may be attached to the upper surface of the sensor chip 2 via a conductive attachment material 8. In addition, the light-emitting device 3 may also be electrically coupled to the conductive contact 204 at the upper surface of the sensor chip 2 via the conductive wire 9. In various embodiments, different light-emitting devices 3 may be electrically coupled to the sensor chip 2 by different means, e.g., via the conductive attachment material 8, via the conductive wire 9 or via a combination of the two. In addition, the light-emitting device 3 is not limited to the types mentioned above, but may comprise various types of light sources which can be used in the proximity sensor 200.

The non-transparent isolation structure 4 is used for isolating the sensor region 201 from the attachment region 202, and thus isolating the sensor region 201 from the light-emitting device 3, so as to prevent light radiated by the light-emitting device 3 from directly arriving at the sensor region 201 without being reflected by an object nearby. The isolation structure 4 may be made of various types of non-transparent materials, e.g., a non-transparent polymer material, a ceramic material or silicon, etc. When the isolation structure 4 comprises a polymer material, the isolation structure 4 may be directly formed on the upper surface of the sensor chip 2 via a molding process. When the isolation structure 4 is made of a ceramic material or silicon etc., the isolation structure 4 may be directly adhered to the upper surface of the sensor chip 2 via an adhesive.

In one embodiment, the non-transparent isolation structure 4 may comprise a first opening 401 and a second opening 402 respectively aligned with the sensor region 201 and the light-emitting device 3, as shown in FIGS. 3B-3E which will be described in detail below. The light radiated by the light-emitting device 3 may be emitted out via the second opening 402 so as to arrive at an object nearby and to be reflected by the object nearby. The light reflected by the object nearby may be received by the sensor region 201 via the first opening 401.

As shown in FIG. 2, the proximity sensor 200 may further comprise a first light-transmitting component 61 covering the first opening 401 and a second light-transmitting component 62 covering the second opening 402. The first light-transmitting component 61 and the second light-transmitting component 62 may, for example, be optical filters, so as to selectively pass light having a particular wavelength (e.g., infrared light) therefrom. For example, the first light-transmitting component 61 and the second light-transmitting component 62 may be glass, at least one surface of which is coated with a material layer selectively allowing light having a particular wavelength to pass.

The non-transparent isolation structure 4 may further comprise a limit part 403 for limiting horizontal positions of the first light-transmitting component 61 and the second light-transmitting component 62, as shown in FIGS. 3B-3E which will be described in detail below. By providing the limit part 403, the first light-transmitting component 61 and the second light-transmitting component 62 may be located more easily and reliably.

In other embodiments, the proximity sensor 200 may also only comprise one of the first light-transmitting component 61 and the second light-transmitting component 62 according to desired specifications.

As shown in FIG. 2, the non-transparent molding material 5 may cover a part of the upper surface of the substrate 1, a part of a side surface and the upper surface of the sensor chip 2, and a part of a side surface and an upper surface of the non-transparent isolation structure 4. The non-transparent molding material 5 may also cover a part of the first light-transmitting component 61 and the second light-transmitting component 62, such that a portion of the first light-transmitting component 61 which is located right above the sensor region 201 is not covered by the non-transparent molding material 5, and such that a portion of the second light-transmitting component 62 which is located right above the light-emitting device 3 is not covered by the non-transparent molding material 5. The non-transparent molding material 5 may also encapsulate the conductive wire 9 for electrically coupling the sensor chip 2 to the substrate 1.

Figure 3A:
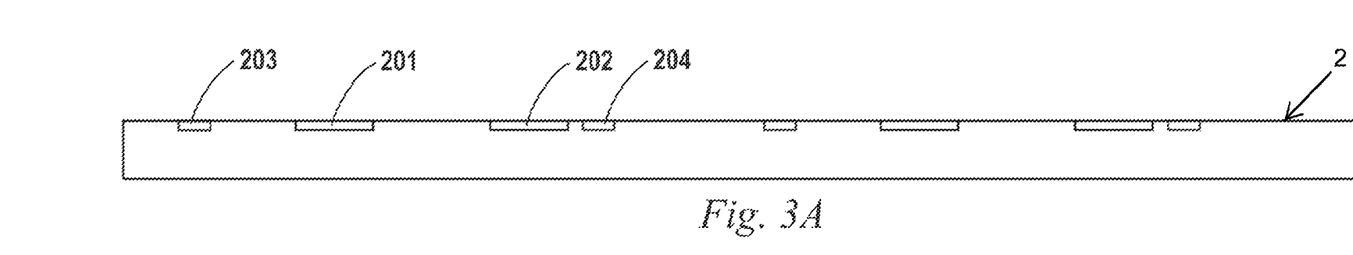
FIGS. 3A-3H are cross-sectional schematic diagrams showing a flow for manufacturing the proximity sensor as shown in FIG. 2.
Figure 3B:
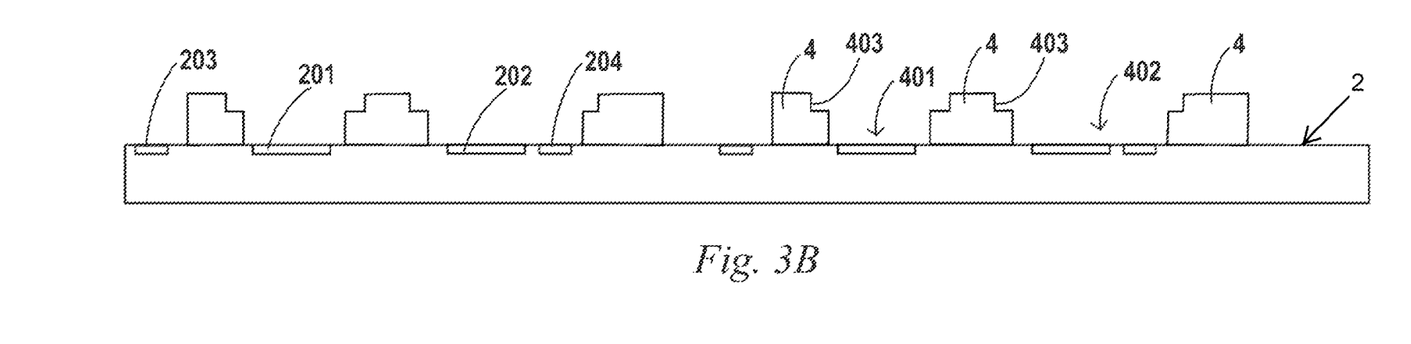
Figure 3C:
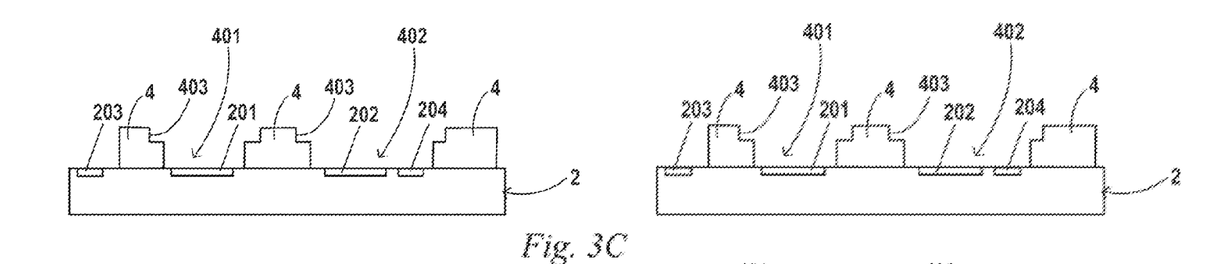
Figure 3D:
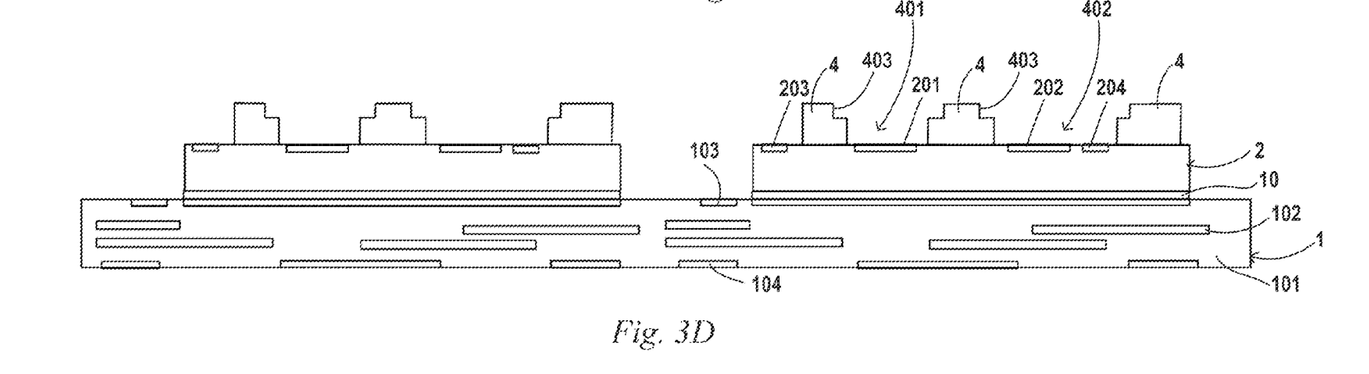
Figure 3E:
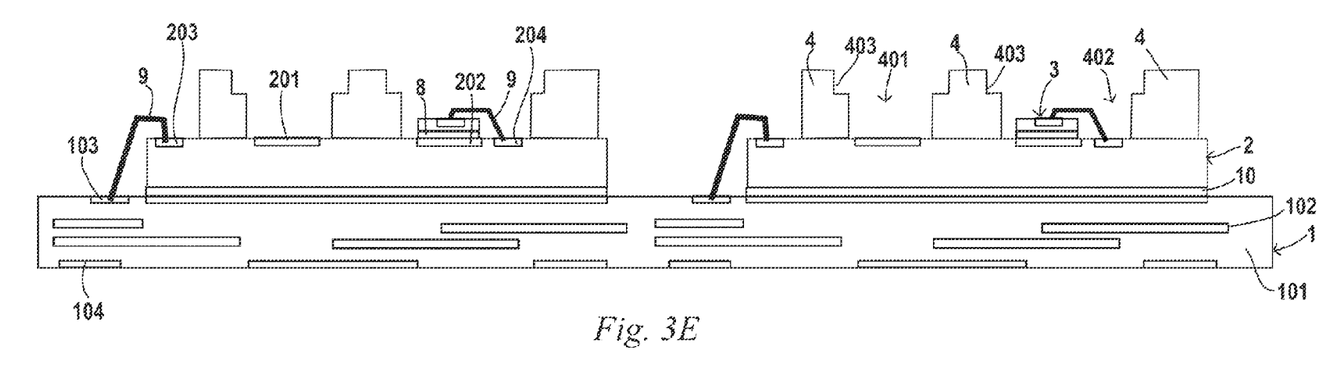
Figure 3F:
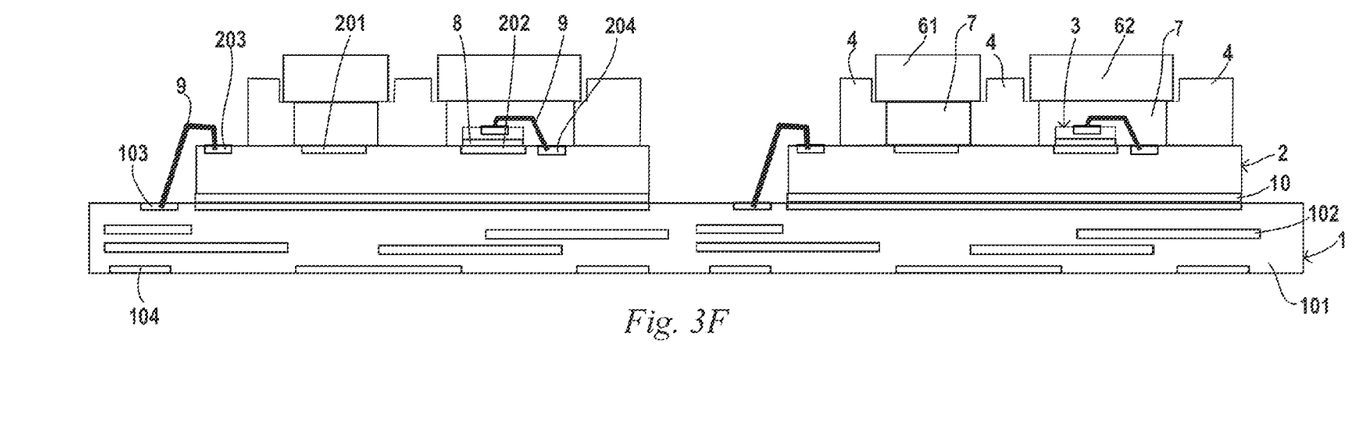

As shown in FIG. 2 and FIG. 3F, the proximity sensor 200 may further comprise a transparent adhesive 7 filled in the first opening 401 and the second opening 402 for adhering the first light-transmitting component 61 and the second light-transmitting component 62 to the sensor chip 2, so as to fix the first light-transmitting component 61 and the second light-transmitting component 62. Therefore, the light radiated by the light-emitting device 3 may be emitted out via the transparent adhesive 7 filled in the second opening 402 and the second light-transmitting component 62 provided above the light-emitting device 3, so as to arrive at an object nearby and to be reflected by the object nearby. Then, the light reflected by the object nearby may pass through the first light-transmitting component 61 provided above the sensor region 201 and the transparent adhesive 7 filled in the first opening 401 to be received by the sensor region 201.

In the proximity sensor 200 in various embodiments, by providing the light-emitting device 3 on the sensor chip 2 and adopting the non-transparent isolation structure 4 and the molding material 5 to package the proximity sensor 200, the use of a cap is avoided, which can reduce the manufacturing costs of the proximity sensor 200, and can improve productivity.

The proximity sensor 200 as shown in FIG. 2 may be applied to various electronic apparatuses. For example, the proximity sensor 200 may be electrically coupled to other circuits in an electronic apparatus via the conductive contact 104 provided at the lower surface of the substrate 1.

FIGS. 3A-3H are cross-sectional schematic diagrams showing a process flow for manufacturing the proximity sensor 200 as shown in FIG. 2. The process for manufacturing the proximity sensor 200 will be described in detail below in conjunction with FIGS. 3A-3H.

As shown in FIG. 3A, a portion of a wafer of a plurality of sensor chips 2 is shown, the sensor chips 2 comprising a sensor region 201 and an attachment region 202 for attaching a light-emitting device 3. The sensor region 201 and the attachment region 202 are provided spaced apart from each other on the upper surface of each sensor chip 2. The sensor region 201 is used for receiving radiation reflected by an object nearby as mentioned above. The sensor chip 2 may further comprise conductive contacts 203 and 204 provided at the upper surface thereof, wherein the conductive contact 203 is used for electrically coupling to the substrate 1 in subsequent steps, while the conductive contact 204 is used for electrically coupling to the light-emitting device 3 in subsequent steps.

As shown in FIG. 3B, a non-transparent isolation structure 4 is provided on the sensor chip 2. The non-transparent isolation structure 4 isolates the sensor region 201 from the attachment region 202. The isolation structure 4 may be made of various types of non-transparent materials, e.g., a non-transparent polymer material, a ceramic material or silicon, etc. When the isolation structure 4 comprises a polymer material, the isolation structure 4 may be directly formed on the upper surface of the sensor chip 2 via a molding process. When the isolation structure 4 is made of a ceramic material or silicon etc., the isolation structure 4 may be formed separately and directly adhered to the upper surface of the sensor chip 2 via an adhesive.

The non-transparent isolation structure 4 may comprise a first opening 401 and a second opening 402. The non-transparent isolation structure 4 is formed on or coupled to the sensor chip 2 with the first opening 401 and the second opening 402, respectively, aligned with the sensor region 201 and the attachment region 202. The non-transparent isolation structure 4 may further comprise a limit part 403 for limiting horizontal positions of a first light-transmitting component 61 and a second light-transmitting component 62 which may respectively cover the first opening 401 and the second opening 402 in subsequent steps. By providing the limit part 403, the first light-transmitting component 61 and the second light-transmitting component 62 may be located more easily and reliably.

In the proximity sensor 200 obtained in subsequent steps, the light radiated by the light-emitting device 3 may be emitted out via the second opening 402 so as to arrive at an object nearby and to be reflected by the object nearby. The light reflected by the object nearby may be received by the sensor region 201 via the first opening 401.

As shown in FIG. 3C, singulation processing may be carried out on the structure obtained in step 2, so as to obtain an individual sensor chip 2, wherein a corresponding isolation structure 4 is provided on individual sensor chips 2.

As shown in FIG. 3D, the sensor chip 2 is arranged on the substrate 1. The substrate 1 exemplarily comprises a dielectric layer 101, a plurality of conductive traces 102 between by the dielectric layer 101, and a first conductive contact 103 and a second conductive contact 104 which are supported by the dielectric layer 101 and coupled to the conductive traces 102. The first conductive contact 103 is provided at the upper surface of the substrate 1 for electrically coupling to the sensor chip 2. The second conductive contact 104 is provided at the lower surface of the substrate 1 for electrically coupling to an external circuit. In other embodiments, the substrate 1 may be in other forms. For example, the substrate 1 may be made of a semi-conductive material in which a circuit is formed. In this case, the sensor chip 2 may be electrically coupled to the circuit in the substrate 1.

As shown in FIG. 3E, a light-emitting device 3 is provided on the attachment region 202; the light-emitting device 3 is electrically coupled to the sensor chip 2; and the sensor chip 2 is electrically coupled to the substrate 1. The light-emitting device 3 may comprise a vertical cavity surface emitting laser (VCSEL) or a light-emitting diode (LED), e.g., an infrared LED. The light-emitting device 3 may be attached to the upper surface of the sensor chip 2 via a conductive attachment material 8. The conductive contact 103 on the substrate 1 may be electrically coupled to a conductive contact 203 on the sensor chip 2 via a conductive wire 9. The light-emitting device 3 may be electrically coupled to a conductive contact 204 on the sensor chip 2 via another conductive wire 9. In various embodiments, the light-emitting device 3 may be electrically coupled to the sensor chip 2 by different means, e.g., via the conductive attachment material 8, via the conductive wire 9 or via a combination of the two. In addition, the light-emitting device 3 is not limited to the types mentioned above, but may comprise various types of light sources which can be used in the proximity sensor 200.

As shown in FIG. 3F, a transparent adhesive 7 may be filled in the first opening 401 and the second opening 402, and then the first light-transmitting component 61 is utilized to cover the first opening 401, and the second light-transmitting component 62 is utilized to cover the second opening 402, such that the first light-transmitting component 61 and the second light-transmitting component 62 are adhered to the sensor chip 2. The first light-transmitting component 61 and the second light-transmitting component 62 are respectively provided in the limit part 403 of the isolation structure 4, and the first light-transmitting component 61 is adhered to the transparent adhesive 7 in the first opening 401, while the second light-transmitting component 62 is adhered to the transparent adhesive 7 in the second opening 402.

In other embodiments, only one light-transmitting component may be provided according to desired specifications, for example, only the first light-transmitting component 61 is provided, only the second light-transmitting component 62 is provided, or one light-transmitting component is provided that covers both the sensor region 201 and the light emitting device 3.

The first light-transmitting component 61 and the second light-transmitting component 62 may, for example, be optical filters, so as to selectively pass light having a particular wavelength (e.g., infrared light) therefrom. For example, the first light-transmitting component 61 and the second light-transmitting component 62 may be glass, at least one surface of which is coated with a material layer selectively allowing light having a particular wavelength to pass.

Figure 3G:
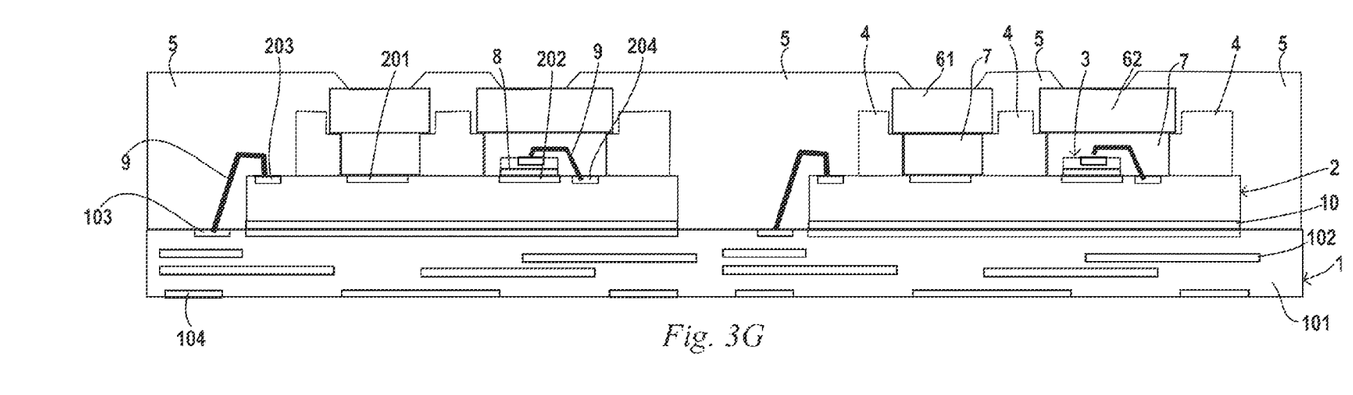

As shown in FIG. 3G, the non-transparent molding material 5 is formed to cover a part of the upper surface of the substrate 1, a part of a side surface and the upper surface of the sensor chip 2, and a part of a side surface and an upper surface of the non-transparent isolation structure 4, such that a portion of the proximity sensor 200 which is located right above the sensor region 201 and the light-emitting device 3 is not covered by the non-transparent molding material 5.

Furthermore, as shown in FIG. 3G, the non-transparent molding material 5 may also be formed to at least partially cover the first light-transmitting component 61 and the second light-transmitting component 62, such that a portion of the first light-transmitting component 61 which is located right above the sensor region 201 is not covered by the non-transparent molding material 5, and such that a portion of the second light-transmitting component 62 which is located right above the light-emitting device 3 is not covered by the non-transparent molding material 5. The non-transparent molding material 5 may also encapsulate the welding wire 9 for electrically coupling the sensor chip 2 to the substrate 1.

Figure 3H:
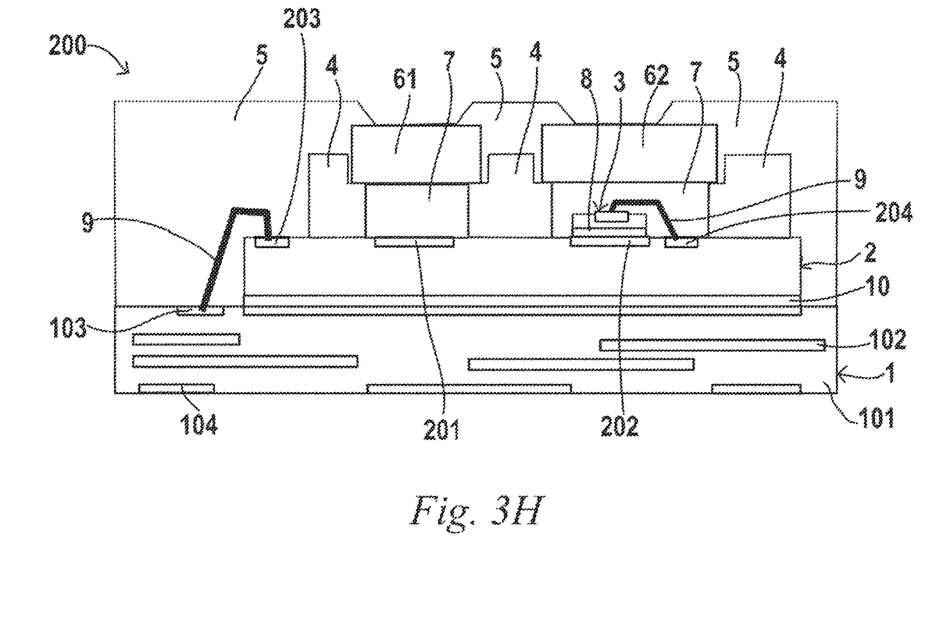

As shown in FIG. 3H, singulation processing is carried out so as to obtain an individual proximity sensor 200.

In operation of the proximity sensor as shown in FIG. 3H, light radiated by the light-emitting device 3 may be emitted out via the transparent adhesive 7 filled in the second opening 402 and the second light-transmitting component 62 provided above the light-emitting device 3, so as to arrive at an object nearby and to be reflected by the object nearby. Then, the light reflected by the object nearby may pass through the first light-transmitting component 61 provided above the sensor region 201 and the transparent adhesive 7 filled in the first opening 401 to be received by the sensor region 201.

In various embodiments of the present disclosure, by providing the light-emitting device 3 on the sensor chip 2 and adopting the non-transparent isolation structure 4 and molding material to package the proximity sensor 200, the use of a cap is avoided, which can reduce the manufacturing costs of the proximity sensor 200, and can improve productivity.

Benefiting from the teaching of the aforementioned description and accompanying drawings, those skilled in the art could think of many modifications to the present disclosure and other embodiments. Therefore, it should be understood that the present disclosure is not merely limited to the disclosed specific embodiments, and modifications and embodiments are all intended to be encompassed within the scope of the appended claims.

Figure 4:
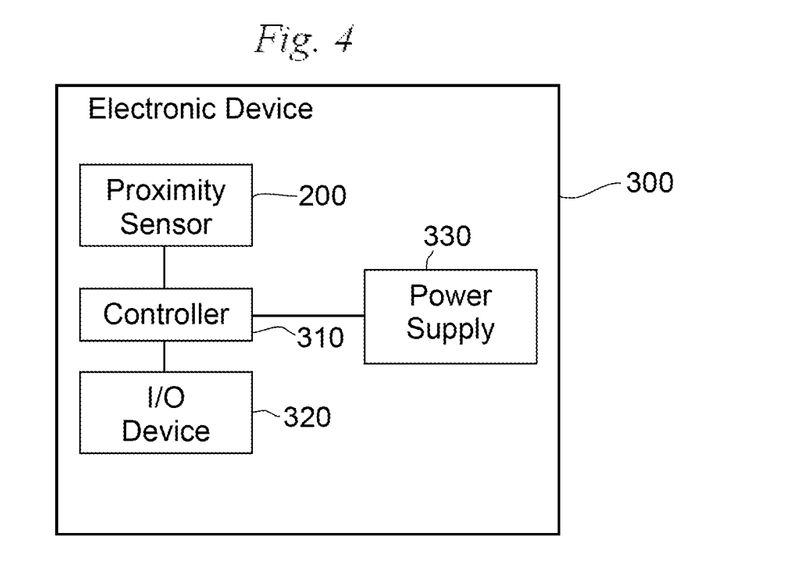
FIG. 4 is a block diagram of an electronic device according to one embodiment of the present disclosure.

FIG. 4 illustrates a block diagram of an electronic device that includes a proximity sensor, such as the proximity sensor 200 of FIG. 2. The electronic device may be a mobile communications apparatus, such as a mobile phone and a personal digital assistant, a laptop, a desktop computer, a camera or video device including a network video, a vehicle parking sensor, a wearable device, such as a smartwatch, or any other electronic device. The electronic device 300 includes a controller 310 and a proximity sensor 200 that is electrically coupled to the controller. The controller 310 includes control circuitry, which may include one or more processors, memory, and discrete logic. The controller 310 is configured to transmit signal to and receive signals from the proximity sensor 200. The electronic device may further include an input/output device 320, for example, a keyboard or a display that is coupled to the controller. The electronic device may further include a power supply 330, which may be a battery or components for coupling to an external power source.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A proximity sensor, comprising:
a substrate;
a sensor chip coupled to a surface of the substrate and electrically coupled to the substrate, the sensor chip including a sensor region;
a light-emitting device coupled to a surface of the sensor chip and electrically coupled to the sensor chip;
a non-transparent isolation structure located on the sensor chip and isolating the light-emitting device from a sensor region of the sensor chip; and
a non-transparent molding material directly coupled to portions of the substrate, the sensor chip and the non-transparent isolation structure, wherein the sensor region of the sensor chip and the light-emitting device are not covered by the non-transparent molding material.

2. The proximity sensor as claimed in claim 1, wherein the non-transparent isolation structure comprises a first opening and a second opening respectively aligned about the sensor region and the light-emitting device.

3. The proximity sensor as claimed in claim 2, further comprising a first light-transmitting component covering the first opening and a second light-transmitting component covering the second opening.

4. The proximity sensor as claimed in claim 3, wherein the non-transparent isolation structure further comprises recessed structures for supporting the first light-transmitting component and the second light-transmitting component.

5. The proximity sensor as claimed in claim 3, wherein the non-transparent molding material partially covers the first light-transmitting component and the second light-transmitting component, wherein a portion of the first light-transmitting component that is located above the sensor region is not covered by the non-transparent molding material, and a portion of the second light-transmitting component that is located above the light-emitting device is not covered by the non-transparent molding material.

6. The proximity sensor as claimed in claim 3, further comprising transparent adhesive in the first opening and the second opening, the transparent adhesive coupling the first light-transmitting component and the second light-transmitting component to the sensor chip.

7. The proximity sensor as claimed in claim 1, wherein the non-transparent isolation structure is a molding material.

8. The proximity sensor as claimed in claim 1, wherein the non-transparent isolation structure is coupled to the sensor chip by an adhesive.

9. The proximity sensor as claimed in claim 1, wherein the light-emitting device is coupled to the sensor chip by a conductive attachment material.

10. An electronic apparatus, comprising:
a proximity sensor including:
a substrate;
a sensor chip coupled to a surface of the substrate and electrically coupled to the substrate, the sensor chip including a sensor region;
a light-emitting device coupled to a surface of the sensor chip and electrically coupled to the sensor chip;
a non-transparent molding material on the surface of the sensor chip between the light-emitting device and a sensor region of the sensor chip, the non-transparent molding material molded to a surface of the substrate and a surface of the sensor chip, wherein the non-transparent molding material has a first opening that exposes the sensor region of the sensor chip and a second opening that exposes the light-emitting device; and
a controller coupled to the proximity sensor.

11. The electronic apparatus as claimed in claim 10, further comprising transparent molding material over the sensor region of the sensor chip and the light-emitting device.

12. The electronic apparatus as claimed in claim 10, wherein the electronic apparatus is at least one of a mobile phone, a personal digital assistant, a laptop, a desktop computer, a wearable device, a camera and a video device.

13. A method for manufacturing a proximity sensor, comprising:

coupling a non-transparent isolation structure to a surface of a sensor chip between a sensor region and an attachment region, the non-transparent isolation structure isolating the sensor region from the attachment region;
coupling the sensor chip to a substrate;
electrically coupling the sensor chip to the substrate;
coupling a light-emitting device to the attachment region of the sensor chip;
electrically coupling the light-emitting device to the sensor chip;
placing the substrate, the sensor chip, and the light-emitting device in a mold; and
providing a non-transparent molding material into the mold to mold the non-transparent molding material to surfaces the substrate, the sensor chip and the non-transparent isolation structure, wherein the non-transparent molding material is not molded to a sensor region of the sensor chip and the light-emitting device.

14. The method as claimed in claim 13, wherein the non-transparent isolation structure comprises a first opening and a second opening, and when coupling the non-transparent isolation structure to the surface of the sensor chip, the first opening and the second opening are respectively aligned about the sensor region and the attachment region.

15. The method as claimed in claim 14, further comprising:
after electrically coupling the light-emitting device to the sensor chip and before placing the substrate, the sensor chip, and the light-emitting device in the mold, covering the first opening with a first light-transmitting component, and covering the second opening with a second light-transmitting component.

16. The method as claimed in claim 15, wherein prior to coupling the non-transparent isolation structure, the method further comprises forming recesses in the in the non-transparent isolation structure at the first and second openings, wherein the first light-transmitting component and the second light-transmitting component are coupled to the non-transparent isolation structure in the recesses.

17. The method as claimed in claim 15, further comprising:
after at least partially covering the first opening with the first light-transmitting component and covering the second opening with the second light-transmitting component, at least partially covering the first light-transmitting component and the second light-transmitting component with the non-transparent molding material, such that a portion of the first light-transmitting component that is located above the sensor region is not covered by the non-transparent molding material, and a portion of the second light-transmitting component that is located above the light-emitting device is not covered by the non-transparent molding material.

18. The method as claimed in claim 15, further comprising:
after electrically coupling the light-emitting device to the sensor chip and before covering the first opening with the first light-transmitting component and covering the second opening with the second light-transmitting component, filling, in the first opening and the second opening, a transparent adhesive for adhering the first light-transmitting component and the second light-transmitting component to the sensor chip.

19. The method as claimed in claim 13, wherein coupling the non-transparent isolation structure on the sensor chip comprises:
coupling the non-transparent isolation structure to the sensor chip in a molding process.

20. The method as claimed in claim 13, wherein coupling the non-transparent isolation structure on the sensor chip comprises:
adhering the non-transparent isolation structure to the sensor chip using an adhesive.

21. The method as claimed in claim 13, coupling the light-emitting device to the sensor chip comprises using a conductive attachment material to couple the light-emitting device to the sensor chip.

22. The method as claimed in claim 13, further comprising:
after providing the non-transparent material into the mold, carrying out singulation processing.

23. The method as claimed in claim 13, wherein coupling the light-emitting device to the attachment region of the sensor chip electrically couples the light-emitting device to the sensor chip.

* * * * *